United States Patent [19]

O'Dougherty

[11] Patent Number: 5,293,893

[45] Date of Patent: Mar. 15, 1994

[54] EMPTY DRUM DETECTING APPARATUS

[75] Inventor: Kevin T. O'Dougherty, Minneapolis, Minn.

[73] Assignee: FSI International, Inc., Chaska, Minn.

[21] Appl. No.: 9,725

[22] Filed: Jan. 27, 1993

[51] Int. Cl.$^5$ .............................. G05D 7/06
[52] U.S. Cl. ................... 137/113; 137/171; 137/599
[58] Field of Search ........... 137/113, 110, 171, 599

[56] References Cited

U.S. PATENT DOCUMENTS

| | | | |
|---|---|---|---|
| 2,146,729 | 2/1939 | Gavin | 137/113 |
| 3,474,821 | 10/1969 | Fuller | 137/390 |
| 3,537,616 | 11/1970 | Diebel et al. | 222/66 |
| 3,787,829 | 1/1974 | Schneier | 340/244 |
| 4,247,018 | 1/1981 | Credle | 137/113 X |
| 4,305,527 | 12/1981 | McMillin et al. | 222/1 |
| 4,467,941 | 8/1984 | Du | 222/1 |
| 4,516,986 | 5/1985 | Jepsen | 137/110 X |
| 4,574,827 | 3/1986 | Konak | 137/599 X |
| 4,601,409 | 7/1986 | DiRegolo | 222/1 |
| 5,040,564 | 8/1991 | Auvoja | 137/113 X |
| 5,108,015 | 8/1992 | Rauworth et al. | 222/400 |
| 5,129,415 | 7/1992 | Runyon et al. | 137/113 |

FOREIGN PATENT DOCUMENTS

| | | | |
|---|---|---|---|
| 481116 | 2/1952 | Canada | 137/113 |
| 1069510 | 7/1954 | France | 137/171 |

*Primary Examiner*—Stephen M. Hepperle
*Attorney, Agent, or Firm*—Palmatier, Sjoquist & Helget

[57] ABSTRACT

Empty drum detecting apparatus comprises an upright manifold chamber connected at its intermediate portion to a supply line extended to a supply drum of liquid chemical, and a pump for directing pumped liquid to process equipment utilizing the liquid chemical and having an inlet line. An outlet line is connected to the bottom portion of the upright manifold chamber and connected to the inlet line of the pump; and a shunt line with a flow restriction therein is connected between the upper portion of the manifold chamber and the outlet line for delivering collected gases and liquid to the inlet line and pump. An alternate flow restricting valve may be placed in the outlet line to restrict liquid flow from the lower portion of the manifold chamber. A capacitance proximity sensor is mounted above the inlet of the manifold chamber and senses the liquid level in the manifold chamber to produce an indication of the liquid level.

13 Claims, 2 Drawing Sheets

EMPTY DRUM DETECTING APPARATUS

This invention relates to apparatus for detecting the empty state of a supply drum of liquid chemical which is regularly being supplied to process equipment.

BACKGROUND OF THE INVENTION

Certain process equipment in industrial installations, such as for the purpose of processing semiconductor wafers in the manufacture of circuit chips, requires the substantially uninterrupted flow of liquid chemicals to be drawn on at the proper time for performing specific functions in the processing equipment. For instance, certain stages of semiconductor wafer processing requires a supply of acid, such as hydrofluoric acid, for the purpose of etching oxides from the surfaces of the semiconductor wafers. The supply drums for such liquid chemicals are usually located in a protected room or building remote from the processing station, and arrangements are made in the facilities housing the supply drums for changing the drums when the chemical in a supply drum is depleted so that a new drum may be substituted for the empty one.

An important consideration in the supplying of liquid chemicals from such drums is to be sure that a continuous supply of the liquid chemical is available to the processing equipment. Accordingly, temporary storage facilities for the liquid chemical are provided between the supply drums and the processing equipment, but of course, the temporary storage facilities must be adequately supplied with the liquid chemical so that the supply to the processing equipment will be continuous.

Another important consideration in the supplying of liquid chemical from the source or supply drums, is the disposal of gas that may be drawn into the delivery system, particularly when the supply of liquid chemical in the supply drums is exhausted and air or gas is drawn into the delivery system. Gas may also be drawn into the delivery system by leakage. Usually a mechanical coupling is provided between supply tubes in such a supply drum, and flow lines which deliver liquid chemical to the processing facility. A representative coupling is illustrated in U.S. Pat. No. 5,108,015. Although such couplings make tight joints for liquid flow, gas leakage into the flowing liquid is not uncommon and must be accommodated.

Prior devices for generally the same purpose are illustrated in U.S. Pat. Nos. 3,787,829 and 4,601,409. The apparatus in both of these prior devices are subject to giving false readings of an empty drum when the supply drum may not actually be empty. In the '829 patent, false readings to indicate an empty drum may occur in the event leakage gases become entrained in the liquid chemical, and such gases collect in the float chamber. A substantial amount of temporary storage downstream of the pump in the '829 patent is required during recovery after an empty tank has been detected and a new supply drum has been substituted.

The '409 patent requires the use of a separate aspirator during recovery after an empty supply tank has been detected and a change to a different tank is effected. The '409 patent may also give false readings of an empty condition in the supply tank by virtue of gas leakage that may become entrained in the liquid being supplied and collection of such gas in the reservoir.

SUMMARY OF THE INVENTION

An object of the invention is to provide apparatus to reliably indicate emptying of a supply drum of liquid chemical, regardless of gas leakage into the liquid delivery system, and to minimize the need for temporary liquid storage between the supply drum and the processing equipment which uses the liquid.

A feature of the invention is an upright manifold chamber interposed between the supply drum and the liquid pump wherein upper and lower portions of the manifold chamber are both connected into the inlet line to the pump. A supply line from the supply drum is connected into the manifold chamber at a location intermediate the upper and lower portions thereof. A flow restriction is placed in a shunt flow line which is connected from the upper portion of the manifold. An outlet flow line providing for the primary flow to the pump is connected to the lower portion of the manifold chamber to the outlet line. The flow restriction is located immediately adjacent the upper portion of the manifold chamber to continuously allow gas to be drawn from the manifold chamber by the pump, and to restrict liquid flow from the top of the chamber.

An optional on-off valve may be provided in the outlet flow line adjacent the lower portion of the manifold chamber to be closed during start-up or recovery operation after a new supply drum is connected into the system, as to allow the pump to quickly draw off all the gases that have been collected in the manifold chamber, and without requiring a substantial volume of liquid to be pumped, which might overload temporary reservoir facilities for the liquid downstream of the pump.

A sensor adjacent the manifold chamber and preferably above the level of the liquid inlet on the side portion of the manifold chamber is preferably a capacitive proximity sensor producing a level signal when liquid level in the chamber has dropped below the sensor level. The level signal from the sensor is supplied to a control panel which produces output indications for alerting operating personnel and/or for initiating the operation functioning devices to correct the lower liquid level condition in the manifold chamber.

BRIEF DESCRIPTION OF THE DRAWINGS

FIG. 3 is an enlarged detail elevation view, partly broken away and shown in section and illustrating the liquid manifold, upon which operation of the invention relies.

DETAILED SPECIFICATION

Figure 1:
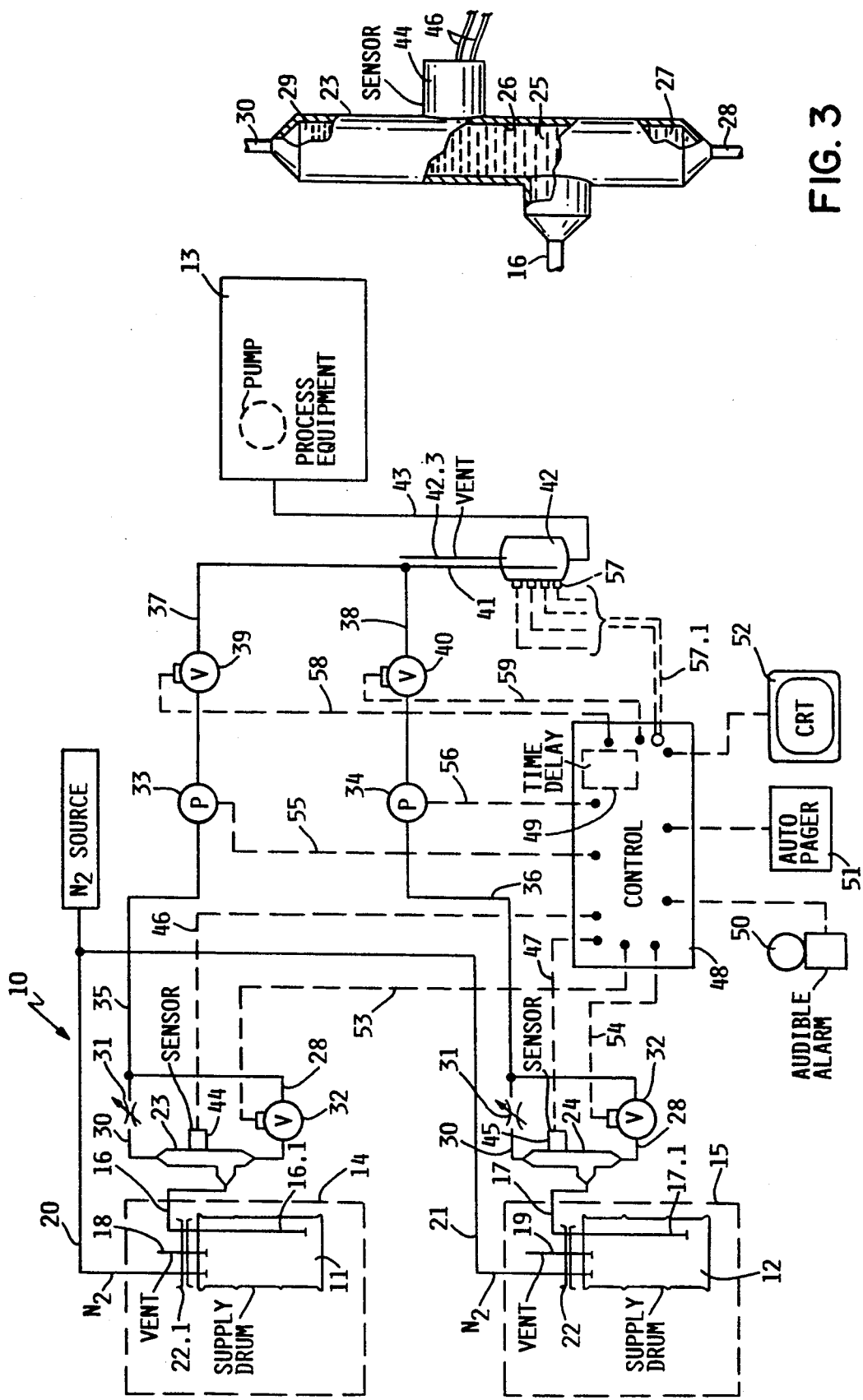
FIG. 1 is a schematic diagram illustrating the present invention.

In the form of the invention illustrated in FIGS. 1 and 3, the empty drum detecting apparatus, indicated in general by numeral 10, is for the purpose of determining and producing indications when supply drums 11 and 12 have been emptied of the liquid that is being supplied for the process equipment 13. The process equipment may take any of a number of forms and typically may be processing equipment for processing silicon wafers in the manufacture of circuit chips. The liquids contained in the drums 11 and 12 may be any number of processing liquids, and may comprise acids such as hydrochloric acid, hydrofluoric acid, or sulfuric acid, or may comprise hydrogen peroxide or similar bases, or may even comprise photoresist that is regularly used in the processing of silicon wafers.

The supply drums 11 and 12 are ordinarily stored in separate rooms indicated by the dashed lines 14, 15 so as to be safely handled, and well away from any of the process equipment.

Typically, each of the supply drums has a number of fluid flow lines connected to it. As illustrated, each of the supply drums 11 and 12 has a fluid flow supply line 16 and 17, respectively, connected to it with a supply end portion 16.1, 17.1 extending downwardly into the bottom of the supply drums 11, 12 for the purpose of drawing liquid from the supply drum. It will be noted that the supply end portions 16.1, 17.1 extend nearly to the bottom of each of the supply tanks so that a maximum amount of liquid can be drawn from these tanks before an empty condition is experienced. In addition to the supply lines 16, 17, vent lines 18, 19 have end portions extending into the drums 11, 12; and gas supply lines 20, 21 also have end portions extending into the drums 11, 12 as to supply nitrogen into the drums as the liquid is drawn out. Nitrogen is preferable to air in handling of many chemicals, so as to avoid any possible change in the chemical while it is being stored. Of course, other gases may be supplied into the drums in place of nitrogen, depending on the nature of the chemicals being stored. In order to facilitate rapid removal of the supply tanks or drums 11, 12, separable couplings 22.1, 22 are provided at the top of the drums in order to facilitate disconnecting the flow lines from the end portions thereof which extend into the tanks or drums 11, 12. The couplings 22.1, 22 may be of any of a number of possible constructions, but a preferred form is the coupling illustrated in U.S. Pat. No. 5,108,015, the disclosure of which is incorporated by reference. The end portions 16.1, 17.1 of the supply lines and the end portions of the vent lines and of the nitrogen lines are substantially permanently installed in the supply tanks or drums 11, 12 so that by decoupling the couplings 21, 22, the supply tanks 11, 12 may be readily changed when an empty condition is experienced.

The supply lines 16, 17, and other liquid flow lines referred in this specification, are preferably formed of plastics which are resistant to the deteriorating effect of strong chemicals such as acids, bases and the like. Such flow lines may be tubing or pipes, depending upon the exact nature of the installation, and may be formed of plastics known as PVDF, or other fluoropolymers such as perfluoroalkoxy (Teflon ® PFA), PEEK, polyetheretherketone, or other plastics.

The pipe or tubings will be sized according to the requirement, but in many cases, tubings or pipe with an internal diameter of 3/8 inch to $\frac{3}{4}$ inch will be adequate.

Each of the supply lines 16, 17 is connected to a manifold 23, 24 which is constructed substantially as illustrated in FIG. 3. Both of the manifolds 23 and 24 are identical and accordingly an understanding of one will be adequate for an understanding of both. The supply line is connected to the manifold 23 so as to supply fresh liquid into an intermediate portion 25 of the manifold chamber 26. The lower portion 27 of the manifold chamber is connected to an outlet flow line 28 which, during normal operation of the chemical transfer system, will carry the principal flow of liquid from the supply tank to the process equipment 13.

The upper portion 29 of the manifold chamber 26 is connected to a shunt flow line 30 which contains a flow restriction 31 which minimizes the flow of liquid through the shunt line 30, but allows flow of gases freely therethrough. The flow restriction 31 may be an orifice or a needle valve. Alternately, the supply lines 16, 17 may connect to the manifolds 23, 24 at approximately the same elevation that the outlet lines 28 connect to the manifolds, and in this alternative, the intermediate portion 25 is at substantially the same elevation as the outlet portion 27.

The outlet flow lines 28 of both of the manifolds 23 and 24 each contain a controllable on/off valve 32 which may be a solenoid valve as illustrated, or a pneumatically operated valve might also be a hand operated valve. The controllable valve 32 will be operated to close and open the outlet flow line 28.

Separate pumps 33, 34 are provided for drawing liquids from the separate supply tanks 11, 12, and each of the pumps 33, 34 has an inlet line 35, 36, respectively. The inlet lines 35, 36 are connected to both the outlet lines 28 and the shunt lines 30, which are connected to the respective manifolds 23, 24.

Pumps 33, 34 are preferably reciprocating pumps and are preferably all formed of plastic resistant to the deteriorating effect of chemicals being pumped. Each of the pumps 33, 34 is connected to a discharge line 37, 38 which contain control valves 39, 40 as to entirely close the discharge lines 37, 38. Valves 39, 40 may be pneumatically operated or solenoid operated. Discharge lines 37, 38 are connected to a common source line 41 for supplying liquid into a reservoir tank 42. In the arrangement illustrated in FIG. 1, the reservoir tank 42 may have a relatively small capacity, in the range of 15 liters or less. The reservoir tank 42 may supply the chemical through the process line 43 to the process equipment 13. In most cases, the reservoir tank 42 will have a vent line 42.3 discharging accumulated gases to the atmosphere or into other facilities as to dispose of gases that may be collected and delivered by the liquid from the pumps 33, 34.

Alternately, instead of allowing vent line 42.3 to vent gases into the atmosphere, the vent line may vent into pressure controlling apparatus as to maintain higher than atmospheric pressure in the reservoir 42; and such pressure controlling apparatus would be likely to include both a back pressure regulator to relieve gas pressures higher than desired operating pressures in reservoir 42, and a front pressure regulator to respond to sensed low gas pressures to add gas to reservoir 42 to bring pressures up to operating levels.

Each of the manifolds 23, 24 also has a sensing means 44, 45 which comprises a capacitive proximity sensor which may be of the type made by Gordon Products, Inc. of Brookfield, Conn. Alternately, the sensors 44, 45 may be optical sensors determining, optically, the level of liquid in the manifolds 23, 24; and in order to accommodate such optical sensing, the manifolds must be optically transparent and may be made of a fluoropolymer plastic such as perfluoroalkoxy, known commercially as Teflon ® PFA. The capacitance proximity sensors 44, 45 are affixed to the outside of the manifolds 23, 24 at a location slightly above the supply line 16; and the capacitance proximity sensors 44, 45 will sense the changing level of liquid in the manifold chamber 26 under various circumstances. The proximity sensors 44, 45 sense and produce an indication of liquid level in the manifold chambers moving downwardly or upwardly and produce an indication of such change in the liquid level in the manifold, and produce indications transmitted by electrical conductors 46, 47 to a control panel 48.

The control panel 48 is programmed to produce a number of output signals, depending upon the circumstances determined; and the control panel also incorporates a time delay so as to delay the production of output signals in relation to the sensing of rising and falling liquid in the manifold chambers. A principal function of the control panel is to produce signals which operate an audible alarm 50 when an empty condition is detected at one of the drums 11, 12, and in addition, the control panel 48 may operate an autopager 51 for an attendant to change the containers 11 and 12, and may also provide a signal to a CRT tube or other similar device to produce an indication or a record of the condition experienced.

Similarly, the control panel is connected by conductors 53 and 54 to the solenoid valves 32 of the outlet lines of the two manifolds 23, 24 so as to open and close the valves 32 at the appropriate time.

The control panel is also connected by conductors 55, 56 to the pumps 33, 34 as to control the operation of the pumps and in varying circumstances, may shut the pumps down to terminate their operation.

Additional proximity sensors 57 may be provided on the reservoir tank 42 to sense the liquid level therein and provide indications through conductors 57.1 to the control panel 48 of the liquid conditions in the reservoir 42 and produce certain responses or signals in response to varying liquid level conditions in the reservoir 42. For instance, the valves 39 and 40 are connected by conductors 58, 59 to the control panel 48 and may be operated in the event of an overflow condition of reservoir 42. With respect to the production of an indication of an empty condition at one of the drums 11, 12, assume that pump 33 is operating to draw liquid from the supply drum 11 and to deliver the liquid to the reservoir tank 42 to allow the process equipment to draw liquid therefrom. Pump 34 may temporarily be shut down while liquid is being drawn from the supply tank 11. The manifold 23 will be essentially full of liquid and liquid is flowing from the supply line 16 into the manifold chamber 26 of manifold 23 and the liquid is being drawn through the outlet line to the pump 33; and simultaneously, liquid is being drawn through the shunt line 30 and through the flow restriction 31 to the pump 33 as well.

During the normal flow of liquids and gases out of and into the tank 11, some gas leakage may be experienced as from a connector 21 so that small quantities of gas may be entrained in the liquid and supplied into the manifold 23. Any small quantities of dissolved gas in solution and entrained gas supplied from the supply line 16 and into the manifold chamber 26 will be separated out of the liquid in the manifold chamber and collected in the upper portion 29 of the chamber, and the normal operation of pump 33 will draw the gases from the upper portion 29 of the chamber along with liquids that also flow through the shunt line 30 as the principal flow of liquid from the manifold is flowing through the outlet line 28. The pump carries the liquid with gases entrained therein and moves liquid through the discharge line 37 to the reservoir 42 where the entrained gases are allowed to escape and be disposed of through the vent line 42.3.

When the level of liquid in the drum 11 recedes downwardly to the end of the supply end portion 16.1 of the supply line, the supply line will no longer be immersed in therefore the supply line 16 will start drawing gas from the inside of the drum 11 and the gas will be delivered to the manifold chamber 26. Such gases drawn into the manifold chamber 26 in substantial quantity will initially be collected in the upper portion 29 of the manifold chamber and the gases will start to be drawn out through the shunt line 30. The liquid continues to be drawn by the pump 33 from the outlet line 28 and the level of liquid in the manifold chamber 26 recedes downwardly. As the liquid level reaches the sensing means 44, an indication of the receding liquid level is transmitted by the conductor 46 to the control panel 48. The time delay 49 operates to prevent the control panel from responding to the indication received from the sensing means 44 for a few seconds so that a false reading of receding liquid level in the manifold will not be detected. After a short time delay, if the sensing means 44 continues to produce an indication that the liquid level in the manifold chamber 26 continues to recede, the control panel will produce a signal to operate the audible alarm and the autopager and to record the condition on the CRT or other recording device 52.

The attendant, who has been notified by the audible alarm 50 or the autopager 51, will proceed directly to the storeroom 14 to move the drum 11 and replace it with another drum. In order that liquid will continuously be supplied to the reservoir tank 42 so that the supply of liquid is not interrupted for the process equipment 13, the control panel 48 may shut down the pump 33 and initiate operation of the pump 34 as to commence drawing liquid from the drum 12.

The drum 12, which had been previously replaced and is full of liquid, and which has been primed to remove gas from supply line 17 and end portion 17.1, is prepared to start supplying liquid to the pump 34 as soon as the pump starts drawing liquid.

The priming of drum 12 is carried out while liquid is still being drawn from drum 11, by operating pump 34 while valve 32, adjacent manifold 24, is closed. During priming of drum 12, the pump 34 commences its operation, and the control panel 48 will operate the valve 32 connected with manifold 24 so as to close the outlet line 28 from manifold 24. The operation of the pump 34 causes any gas that exists in the supply line 17 and in the chamber of manifold 24 to be drawn through the shunt line from manifold 24 and to the pump 34. Because there is no flow of liquid through the outlet line 28 from manifold 24, the gas in the manifold 24 and supply line 17 is soon exhausted and the manifold chamber 26 of manifold 24 will be entirely filled with liquid, whereupon liquid commences to flow through the shunt line 30 and flow restriction 31. This small amount of liquid will not over fill the reservoir 42. As the gas is pumped out of manifold 24, the sensor means 45 of the manifold 24 senses the rise of liquid level in the manifold 24, and after a short time delay, will produce an indication to the control panel 48 that the manifold 24 is again full of liquid, whereupon the control panel causes opening of the valve 32 connected with the manifold 24, thereby allowing the normal flow of liquid from the bottom of the manifold 24 and to the pump 34.

The indication from sensing means 45 that the liquid level in manifold 24 has risen to and above operating levels also causes control panel 48 to shut down pump 34 because priming of drum 12 is completed. Pump 34 remains inactive until drum 11 is emptied and sensing means 44 provides an indication thereof to the control panel 48, whereupon pump 33 is shut down and pump 34 is again activated to commence pumping liquid from drum 12 to reservoir 42.

While the pump 34 is drawing liquid from the bottom of the manifold 24, liquid is also being drawn through the shunt line 30 at the top of manifold 24 and through the flow restriction 31 therein; and this continued flow of liquid from the top of the manifold 24 also will carry away to the pump 34 any entrained gas that may exist in the liquid and in the chamber 26 of the manifold 24.

As sensing means 44 indicates to control panel 48 the emptying of the drum 11, the alarm 50, pager 51, and CRT 52 are operated again as described. Drum 11 will be changed, and subsequently primed, as described in connection with drum 12, while pump 34 continues to draw liquid from drum 11 for reservoir 42.

Where in FIG. 1, the small liquid reservoir 42 functions to dispose of collected gases as well as to dampen out pulses of liquid flow while maintaining a continual supply of liquid available for the process equipment, in certain installations, the reservoir 42 may utilize a bladder or diaphragm as to prevent gases from engaging the liquid contained therein, and under these circumstances, additional facilities may be necessary to dispose of gases that flow in the liquids from the pumps 33, 34. Such gas disposing facilities are simply provided in series with the pumps 33, 34 or in series with the reservoir 42.

Figure 2:
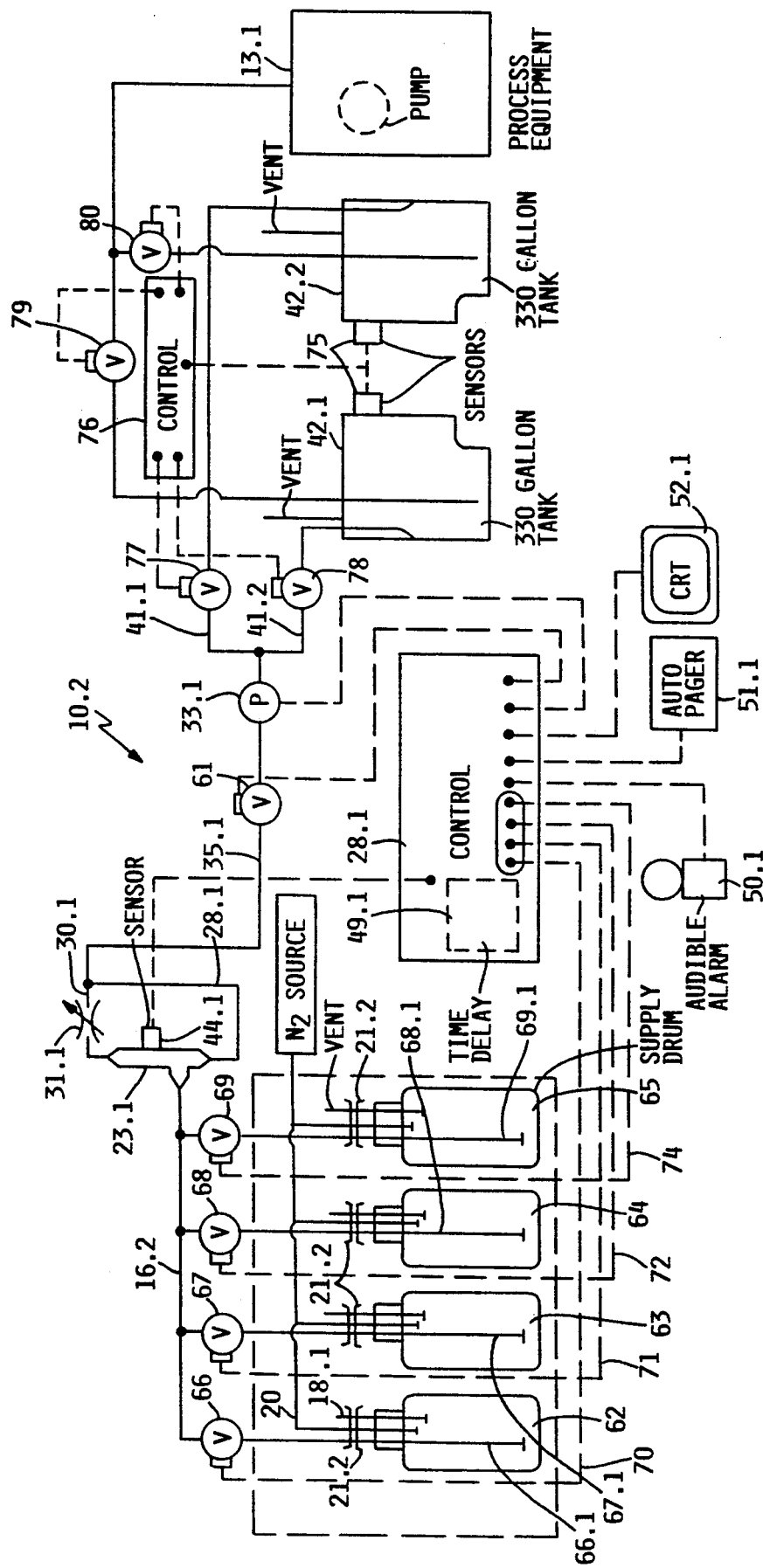
FIG. 2 is a schematic diagram illustrating an alternate form of the present invention.

In the arrangement of the invention as illustrated in FIG. 2, the function of the manifold 23.1 is substantially as described in connection with the manifold 23 in FIG. 1, with the exception that the outlet flow line 28.1 connected to the bottom of the manifold 23.1 is continuous and there is no control valve in the outlet line 28.1. The shunt line 30.1 has a flow restriction 31.1 like that described in connection with FIG. 1, and the pump 33.1 draws liquid from the manifold 23.1 through an inlet line 35.1 which, in this case, has an on/off valve 61 therein The on/off valve 61 is a solenoid valve or pneumatic valve operated by the control panel 28.1 in response to certain input indications. The supply flow line 16.2, which supplies liquid from any of the various supply drums 62, 63, 64, 65, is connected through solenoid valves or pneumatic valves 66, 67, 68, 69 to the supply end portions 66.1, 67.1, 68.1 and 69.1 which respectively extend into the bottoms of the supply drums 62-65. As illustrated in connection with FIG. 1, each of the drums 62-65 has a connector 21.2 connecting the several flow lines, particularly the supply end portions, the vent lines 18.1, and nitrogen gas lines 20, so as to allow for rapid changing of the supply drums 62-65 when they have been emptied.

In the empty drum detecting apparatus 10.2 of FIG. 2, when one of the drums, such as drum 62, has been emptied of liquid and the supply line 16.2 starts sucking gas into the manifold 23.1, the level of liquid in the manifold will recede downwardly past the sensor 44.1 as to produce an indication to the control panel 28, whereupon, the control panel will produce a signal through a conductor 70 to the valve 66 as to close the valve 66 and a signal will also be transmitted through a conductor 71 to the valve 67 for opening the valve 67 as to commence drawing liquid from the respective supply tank or drum 63. As the drums 62-65 successively empty, the control panel 28 will operate the valves 66-69 through the electrical connections 70-74 so as to successively connect the several drums to the manifold and to the pump 33.1 which draws the liquids therefrom. As described in connection with FIGS. 1 and 3, when one of the drums such as drum 62 is emptied of liquid, and gas is drawn into the manifold 23.1 and the valves 66 and 67 operate as to connect the drum 63 to the supply line 16.2 instead of the drum 62, a quantity of gas will exist temporarily in the supply end portion 67.1 and in the supply line 16.2 and in the manifold 23.1, whereupon the pump 33 will draw the gas from the top of the manifold chamber while the liquid is being also drawn from the bottom of the manifold 23.1 and through the outlet line 28.1.

Because there is no valve closing the outlet line 28.1 as in FIG. 1, the drawing of all of the gas out of the manifold 23.1 may take somewhat longer in the arrangement of FIG. 2 than in the case of FIG. 1 where the valve 32 is provided. However, in the system of FIG. 2, pump 33.1 is connected through source lines 41.1, 41.2 to reservoir tanks 42.1, 42.2 which are extremely large tanks of over 100 gallons and as illustrated, are tanks with a capacity of about 330 gallons. Because of the large size of the tanks 42.1, 42.2, the longer period of time required for drawing the gases out of the manifold 23.1 is of little consequence. The process equipment 13.1 may have its own pump to draw liquid from one of the tanks 42.1, 42.2, depending upon the level in those tanks which is sensed by the sensors 75. A control panel 76 receives the indications from the sensors 75 as liquid levels in the tanks recede and rise so as to operate the solenoid valves 77, 78 to control the flow of liquid into the tanks 42.1, 42.2; and the control panel also operates the valves 79, 80 which control the flow of liquid to the process equipment 13.1.

As described in connection with FIG. 1, when indications are received by the control panel 28.1 from the sensor 44.1, a time delay 49.1 in the control panel operates to delay output signals from being generated so as to prevent false readings of empty being obtained from the manifold 23.1. The control panel 28.1 also operates, as in connection with FIG. 1, an audible alarm 50.1, an autopager 51.1. for the attendant, and a CRT screen or recording 52.1.

The present invention may be embodied in other specific forms without departing from the spirit or essential attributes thereof, and it is therefore desired that the present embodiment be considered in all respects as illustrative and not restrictive, reference being made to the appended claims rather than to the foregoing description to indicate the scope of the invention.

I claim:

1. An empty drum detecting apparatus interposed between a liquid supply drum and process equipment utilizing the supplied liquid, comprising a supply line to extend remotely from such a supply drum, a liquid pump and an inlet line to the pump, the pump being adapted to supply liquid to such process equipment, manifold means defining an elongate upright manifold chamber to contain a quantity of the liquid and comprising an upper portion and a lower portion below said upper portion, sensing means adjacent the manifold chamber and producing first and second indications when the liquid level in the manifold chamber respectively rises and lowers relative to the sensor, the supply line being connected into the manifold chamber below the upper portion thereof, an outlet line connected to the lower portion of the manifold chamber and also connected to the inlet line for supplying liquid to the pump, and a shunt line with a restriction to liquid flow therein, the shunt line being connected between the upper portion of the manifold chamber and the inlet line to allow the pump to draw gas and liquid from the upper portion manifold chamber as liquid is also being drawn by the pump from the lower portion of the manifold chamber.

2. An empty drum detecting apparatus according to claim 1 wherein said outlet line has a controllable valve therein, whereby when liquid flow is restricted at the valve, the pump will quickly draw accumulated gas and then liquid through the shunt line and flow restriction during commencing to draw liquid out of the supply drum.

3. An empty drum detecting apparatus according to claim 2 wherein said controllable valve comprises an on-off valve to prevent flow of liquid through the outlet line while the manifold chamber is being emptied of gas.

4. An empty drum detecting apparatus according to claim 1 wherein said supply line comprises a pair of supply end portions respectively extendible into alternate liquid supply drums, and valve means alternately connecting said supply end portions to the supply line in liquid flow relation, and control means responding to the indication from the sensing means and operating the valve means to change the connection of the supply line from one supply end portion and drum to the other supply end portion and the corresponding drum.

5. An empty drum detecting apparatus according to claim 2 wherein control means responds to the indications from the sensing means and operates said controllable valve in the outlet line as the liquid level in the manifold chamber rises and lowers.

6. An empty drum detecting apparatus according to claim 1 wherein said manifold chamber has an intermediate portion between the upper and lower portions, said supply line being connected into the manifold chamber at said intermediate portion.

7. An empty drum detecting apparatus according to claim 6 wherein the sensing means is disposed adjacent the intermediate portion of the manifold chamber.

8. An empty drum detecting apparatus according to claim 7 wherein the manifold chamber has a liquid inlet at said intermediate portion and connected to said supply line, said sensing means being disposed above said liquid inlet.

9. An empty drum detecting apparatus according to claim 1 wherein gas disposal means are connected to the pump for relieving the gases pumped from the manifold chamber.

10. An empty drum detecting apparatus according to claim 9 wherein said gas disposal means comprises a vented reservoir connected to the liquid pump for receiving gases and pumped liquid therefrom.

11. An empty drum detecting apparatus according to claim 10 wherein said outlet line has a controllable valve therein, whereby when liquid flow is restricted at the valve, the pump will quickly draw accumulated gas and then liquid through the shunt line and flow restriction while adding only minimal amounts of liquid to the vented reservoir.

12. An empty drum detecting apparatus according to claim 1 wherein the sensing means comprises a capacitance proximity sensor.

13. An empty drum detecting apparatus according to claim 1 wherein said manifold means comprises an elongate pipe portion comprising a top portion, a bottom portion and a middle portion between the top and bottom portions, the supply line being connected into said middle portion, the outlet line being connected into said bottom portion, and the shunt line being connected into the top portion.

* * * * *